(12) United States Patent
Sun et al.

(10) Patent No.: US 12,167,642 B2
(45) Date of Patent: Dec. 10, 2024

(54) DISPLAY SUBSTRATE AND DISPLAY DEVICE

(71) Applicant: BOE Technology Group Co., Ltd., Beijing (CN)

(72) Inventors: Shuang Sun, Beijing (CN); Fangzhen Zhang, Beijing (CN); Jing Niu, Beijing (CN); Yanan Niu, Beijing (CN); Jintao Peng, Beijing (CN); Lubin Shi, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 54 days.

(21) Appl. No.: 17/769,937

(22) PCT Filed: May 21, 2021

(86) PCT No.: PCT/CN2021/095016
§ 371 (c)(1),
(2) Date: Apr. 18, 2022

(87) PCT Pub. No.: WO2021/254088
PCT Pub. Date: Dec. 23, 2021

(65) Prior Publication Data
US 2023/0111185 A1    Apr. 13, 2023

(30) Foreign Application Priority Data
Jun. 16, 2020    (CN) .......................... 202010550083.7

(51) Int. Cl.
*H01L 27/14*    (2006.01)
*H01L 27/12*    (2006.01)
(Continued)

(52) U.S. Cl.
CPC ....... *H10K 59/1216* (2023.02); *H01L 27/124* (2013.01); *H01L 27/1255* (2013.01); *H10K 59/1213* (2023.02); *H10K 59/131* (2023.02)

(58) Field of Classification Search
CPC ........... H10K 59/1216; H10K 59/1213; H10K 59/131; H01L 27/124; H01L 27/1255;
(Continued)

(56) References Cited

U.S. PATENT DOCUMENTS

| 2012/0313922 A1 | 12/2012 | Toyomura et al. |
| 2017/0053975 A1 | 2/2017 | Cho et al. |
| 2021/0183308 A1 | 6/2021 | Xuan |

FOREIGN PATENT DOCUMENTS

| CN | 203085136 U | 7/2013 |
| CN | 103730450 A | 4/2014 |

(Continued)

OTHER PUBLICATIONS

CN 202010550083.7 first office action.
PCT/CN2021/095016 international search report and written opinion.

*Primary Examiner* — Tan N Tran
(74) *Attorney, Agent, or Firm* — IPro, PLLC

(57) ABSTRACT

The present disclosure provides a display substrate and a display device. The display substrate includes a pixel circuit, and the pixel circuit includes a light-emitting element, a driving circuit and a capacitor circuit. The driving circuit is configured to drive the light-emitting element to emit light; a first terminal of the capacitor circuit is electrically connected to a control terminal of the driving circuit, and a second terminal of the capacitor circuit is electrically connected to a data writing-in node; the capacitor circuit includes at least two capacitors connected in parallel with each other.

16 Claims, 5 Drawing Sheets

(51) Int. Cl.
*H10K 59/121* (2023.01)
*H10K 59/131* (2023.01)

(58) Field of Classification Search
CPC .. H01L 25/167; H01L 25/0753; H01L 27/156
USPC ..................................................... 257/59, 72
See application file for complete search history.

(56) References Cited

FOREIGN PATENT DOCUMENTS

| | | | |
|---|---|---|---|
| CN | 106469745 A | | 3/2017 |
| CN | 106469745 B | * | 3/2017 |
| CN | 108010945 A | | 5/2018 |
| CN | 109308872 A | | 2/2019 |
| CN | 110610684 A | | 12/2019 |
| CN | 111128080 A | | 5/2020 |
| CN | 111653577 A | | 9/2020 |

* cited by examiner

DISPLAY SUBSTRATE AND DISPLAY DEVICE

This application is the U.S. national phase of PCT Application No. PCT/CN2021/095016 filed on May 21, 2021, which claims priority of the Chinese patent application No. 202010550083.7 filed on Jun. 16, 2020, which are incorporated herein by reference in their entities.

CROSS-REFERENCE TO RELATED APPLICATION

This application claims priority of the Chinese patent application No. 202010550083.7 filed on Jun. 16, 2020, which are incorporated herein by reference in their entities.

TECHNICAL FIELD

The present disclosure relates to the field of display technology, and more particularly to a display substrate and a display device.

BACKGROUND

Micro Light Emitting Diode (Micro LED) technology (i.e., LED miniaturization technology) refers to that the traditional LEDs are arrayed and miniaturized to determine the address thereof so as to transfer a large amount of LEDs to the circuit substrate to form LEDs with ultra-fine-pitch. The typical structure of Micro LED is a PN junction diode, which is composed of direct energy gap semiconductor material. When a forward bias is applied to the upper and lower electrodes of the Micro LED, causing the current to pass through, electrons and holes recombine in the active region, emitting a single color light. The driving mode of the Micro LED display is current driving, and the brightness of the Micro LED is positively related to the current flowing through the Micro LED.

In the related art, when the pixel circuit including the micro light emitting diode is in operation, the brightness of the micro light emitting diode is low. Through analysis, it is found that one factor that causes the low brightness of the micro light emitting diode is the gate source voltage of the driving transistor that drives the micro light emitting diode to emit light is low, resulting in insufficient turn-on of the driving transistor, the drain-source current Ids of the driving transistor does not reach the maximum value, and the gate-source voltage of the driving transistor is low, which may be caused by insufficient voltage increasing by bootstrapping of the storage capacitor (the storage capacitor is electrically connected to the gate electrode of the driving transistor), it is necessary to increase the gate-source voltage of the drive transistor by increasing the capacitance value of the storage capacitor.

SUMMARY

An objective of the present disclosure is to provide a display substrate and a display device.

In order to achieve the above objective, the present disclosure provides a display substrate, including: a display substrate, including a pixel circuit, wherein the pixel circuit comprises a light-emitting element, a driving circuit and a capacitor circuit, the driving circuit is configured to drive the light-emitting element to emit light; a first terminal of the capacitor circuit is electrically connected to a control terminal of the driving circuit, and a second terminal of the capacitor circuit is electrically connected to a data writing-in node; the capacitor circuit includes at least two capacitors connected in parallel with each other.

Optionally, the pixel circuit is arranged on a base substrate of the display substrate, and the display substrate comprises a first conductive layer, a first insulating layer, a second conductive layer, a second insulating layer and a third conductive layer sequentially arranged on the base substrate; the capacitor circuit includes a first electrode, a second electrode, a third electrode, a first insulating portion, a second insulating portion and a third insulating portion; the first electrode includes the first conductive layer, the second electrode includes the second conductive layer, the third electrode includes the third conductive layer, and the first insulating portion includes the first insulating layer, the second insulating portion includes a first part of the second insulating layer and the third insulating portion includes a second part of the second insulating layer; the at least two capacitors connected in parallel with each other include a first capacitor and a second capacitor, the first electrode, the first insulating portion and the second electrode constitute the first capacitor, and the second electrode, the second insulating portion and the third electrode constitute the second capacitor; an orthographic projection of the first electrode on the base substrate, an orthographic projection of the first insulating portion on the base substrate, and an orthographic projection of the second electrode on the base substrate at least partially overlap; the orthographic projection of the second electrode on the base substrate, an orthographic projection of the second insulating portion on the base substrate, and an orthographic projection of the third electrode on the base substrate at least partially overlap; the first electrode is electrically connected to the third electrode through a first conductive connection portion, and the first conductive connection portion is arranged in a first via hole penetrating through the first insulating layer, the second conductive layer and the second insulating layer, the third insulating portion is arranged between the first conductive connection portion and the second electrode.

Optionally, the pixel circuit is arranged on a base substrate of the display substrate, and the display substrate comprises a first conductive layer, a first insulating layer, a second conductive layer, a second insulating layer and a third conductive layer that are sequentially arranged on the base substrate; the capacitor circuit includes a first electrode, a second electrode, a third electrode, a first insulating portion, a second insulating portion, a third insulating portion and a fourth insulating portion; the first electrode includes the first conductive layer, the second electrode includes the second conductive layer, the third electrode includes the third conductive layer, and the first insulating portion includes the first insulating layer, the second insulating portion includes a first part of the second insulating layer, the third insulating portion includes a second part of the second insulating layer and the fourth insulating portion includes a third part of the second insulating layer; the at least two capacitors connected in parallel with each other include a first capacitor and a second capacitor, the first electrode, the first insulating portion and the second electrode constitute the first capacitor, and the second electrode, the second insulating portion and the third electrode constitute the second capacitor; an orthographic projection of the first electrode on the base substrate, an orthographic projection of the first insulating portion on the base substrate, and an orthographic projection of the second electrode on the base substrate at least partially overlap; the orthographic projection of the second electrode on the base substrate, an orthographic projection of the second insulating portion on the base substrate, and an orthographic projection of the third electrode on the base substrate at least partially overlap; the first electrode is electrically connected to the third electrode through a first conductive connection portion, and the first conductive connection portion is arranged in a first via hole penetrating through the first insulating layer, the second conductive layer and the second insulating layer, the third insulating portion is arranged between the first conductive connection portion and the second electrode; the first electrode is further electrically connected to the third electrode through a second conductive connection portion, and the second conductive connection portion is arranged in a second via hole penetrating through the first insulating layer, the second conductive layer and the second insulating layer, the fourth insulating portion is arranged between the second conductive connection portion and the second electrode.

Optionally, the first conductive connection portion is arranged on a first side of the second electrode, the second conductive connection portion is arranged on a second side of the second electrode, and the first side and the second side are opposite sides.

Optionally, the first conductive layer is a first gate metal layer, the second conductive layer is a second gate metal layer, the third conductive layer is a source-drain metal layer, and the first insulating layer is a second gate insulating layer, and the second insulating layer is an interlayer dielectric layer; or, the first conductive layer is a portion of an active layer that is a conductor, the second conductive layer is the first gate metal layer, the third conductive layer is the second gate metal layer, and the first insulating layer is a first gate insulating layer, and the second insulating layer is the second gate insulating layer.

Optionally, the pixel circuit is arranged on a base substrate of the display substrate, and the display substrate comprises a first conductive layer, a first insulating layer, a second conductive layer, a second insulating layer, a third conductive layer, a third insulating layer and a fourth conductive layer that are sequentially arranged on the base substrate; the capacitor circuit includes a first electrode, a second electrode, a third electrode, a fourth electrode, a first insulating portion, a second insulating portion, a third insulating portion, a fourth insulating portion, and a fifth insulating portion; the first electrode includes the first conductive layer, the second electrode includes the second conductive layer, the third electrode includes the third conductive layer, and the fourth electrode includes the fourth conductive layer; the first insulating portion includes a first insulating layer, the second insulating portion includes a second insulating layer, the third insulating portion includes a first part of the third insulating layer, the fourth insulating portion includes a second part of the third insulating layer, and the fifth insulating portion includes a third part of the second insulating layer; the at least two capacitors connected in parallel with each other include a first capacitor, a second capacitor and a third capacitor, the first electrode, the first insulating portion and the second electrode constitute the first capacitor; the second electrode, the second insulating portion and the third electrode constitute the second capacitor, the third electrode, the third insulating portion and the fourth electrode constitute the third capacitor; an orthographic projection of the first electrode on the base substrate, an orthographic projection of the first insulating portion on the base substrate, and an orthographic projection of the second electrode on the base substrate at least partially overlap; the orthographic projection of the second electrode on the base substrate, an orthographic projection of the second insulating portion on the base substrate, and an orthographic projection of the third electrode on the base substrate at least partially overlap; the orthographic projection of the third electrode on the base substrate, an orthographic projection of the third insulating portion on the base substrate, and an orthographic projection of the fourth electrode on the base substrate at least partially overlap; the first electrode is electrically connected to the third electrode through a third conductive connection portion, and the third conductive connection portion is arranged in a third via hole penetrating through the first insulating layer, the second conductive layer and the second insulating layer; the fifth insulating portion is arranged between the third conductive connection portion and the second electrode; the second electrode is electrically connected to the fourth electrode through a fourth conductive connection portion, and the fourth conductive connection portion is arranged in a fourth via hole penetrating through the second insulating layer, the third conductive layer and the third insulating layer, the fourth insulating portion is arranged between the fourth conductive connection portion and the third electrode.

Optionally, the third conductive connection portion is arranged on a first side of the second electrode and the third electrode, and the fourth conductive connection portion is arranged on a second side of the second electrode and the third electrode, the first side and the second side are opposite sides.

Optionally, the pixel circuit is arranged on a base substrate of the display substrate, and the display substrate comprises a first conductive layer, a first insulating layer, a second conductive layer, a second insulating layer, a third conductive layer, a third insulating layer and a fourth conductive layer that are sequentially arranged on the base substrate; the capacitor circuit includes a first electrode, a second electrode, a third electrode, a fourth electrode, a first insulating portion, a second insulating portion, a third insulating portion, a fourth insulating portion, a fifth insulating portion, and a sixth insulating portion; the second electrode is electrically connected to the third electrode; the first electrode includes the first conductive layer, the second electrode includes the second conductive layer, the third electrode includes the third conductive layer, and the fourth electrode includes the fourth conductive layer; the first insulating portion includes the first insulating layer, the second insulating portion includes a first part of the third insulating layer, the third insulating portion includes a first part of the second insulating layer, the fifth insulating portion includes a second part of the second insulating layer, the fourth insulating portion includes a second part of the third insulating layer and the sixth insulating portion includes a third part of the third insulating layer; the at least two capacitors connected in parallel with each other include a first capacitor and a second capacitor, the first electrode, the first insulating portion and the second electrode constitute the first capacitor, and the third electrode, the second insulating portion and the fourth electrode constitute the second capacitor; an orthographic projection of the first electrode on the base substrate, an orthographic projection of the first insulating portion on the base substrate, and an orthographic projection of the second electrode on the base substrate at least partially overlap; an orthographic projection of the third electrode on the base substrate, an orthographic projection of the second insulating portion on the base substrate, and an orthographic projection of the fourth electrode on the base substrate at least partially overlap; the first electrode is electrically connected to the fourth electrode through a fifth conductive connection portion, and the fifth conductive connection portion is arranged in a fifth via hole penetrating through the first insulating layer, the second conductive layer, the second insulating layer, the third conductive layer and the third insulating layer; the third insulating portion is arranged between the fifth conductive connection portion and the second electrode, and the fourth insulating portion is arranged between the fifth conductive connection portion and the third electrode; the first electrode is further electrically connected to the fourth electrode through a sixth conductive connection portion, and the sixth conductive connection portion is arranged in a sixth via hole penetrating through the first insulating layer, the second conductive layer, the second insulating layer, the third conductive layer and the third insulating layer; the fifth insulating portion is arranged between the sixth conductive connecting portion and the second electrode, and the sixth insulating portion is arranged between the sixth conductive connection portion and the third electrode.

Optionally, the fifth conductive connection portion is arranged on a first side of the second electrode and the third electrode, and the sixth conductive connection portion is arranged on a second side of the second electrode and the third electrode, the first side and the second side are opposite side.

Optionally, the first conductive layer is a portion of an active layer that is a conductor, the second conductive layer is a first gate metal layer, the third conductive layer is a second gate metal layer, the fourth conductive layer is a source-drain metal layer; the first insulating layer is a first gate insulating layer, the second insulating layer is a second gate insulating layer, and the third insulating layer is an interlayer dielectric layer.

Optionally, the pixel circuit further comprises a compensation circuit, a data writing-in circuit, a light-emitting control circuit, an initialization circuit and a testing circuit; a first terminal of the driving circuit is connected to a power supply voltage; the data writing-in circuit is electrically connected to a gate line and a data line arranged on a base substrate of the display substrate, and a data writing-in node, and is configured to write a data voltage on the data line into the data writing-in node under the control of a gate driving signal provided by the gate line; the light-emitting control circuit is electrically connected to a light-emitting control line, a second terminal of the driving circuit, a first electrode of the light-emitting element, the data writing-in node and a reference voltage input terminal, is configured to connect the second terminal of the driving circuit and the first electrode of the light-emitting element under the control of a light-emitting control signal provided by the light-emitting control line, and write a reference voltage into the data writing-in node; the reference voltage input terminal is used to input the reference voltage, a second electrode of the light-emitting element is connected to a low voltage; the initialization circuit is electrically connected to a reset terminal, the reference voltage input terminal, an initialization voltage terminal, the data writing-in node and the second terminal of the driving circuit, and is configured to write the reference voltage into the data writing-in node under the control of a reset control signal provided by the reset terminal, and write an initialization voltage provided by the initialization voltage terminal into the control terminal of the driving circuit; the compensation circuit is electrically connected to the gate line, a control terminal of the driving circuit and the second terminal of the driving circuit, and is configured to connect the control terminal of the driving circuit and the second terminal of the driving circuit under the control of the gate driving signal; the test circuit is electrically connected to a test control terminal, a first electrode of the light-emitting element and a second electrode of the light-emitting element, is configured to connect the first electrode of the light-emitting element and the second electrode of the light-emitting element under the control of a test control signal provided by the test control terminal.

Optionally, the driving circuit comprises a third transistor, the at least two capacitors connected in parallel with each other comprise a first capacitor and a second capacitor, and the data writing-in circuit comprises a fourth transistor, the light-emitting control circuit includes a fifth transistor and a sixth transistor, the initialization circuit includes a first transistor and a seventh transistor, the compensation circuit includes a second transistor, the test circuit includes an eighth transistor, the light-emitting element is a micro light-emitting diode; a first terminal of the first capacitor is electrically connected to a first terminal of the second capacitor, and a second terminal of the first capacitor is electrically connected to a second terminal of the second capacitor; the first terminal of the first capacitor is electrically connected to the control node, and the second terminal of the second capacitor is electrically connected to the data writing-in node; a gate electrode of the third transistor is electrically connected to the control node, a source electrode of the third transistor is connected to the power supply voltage, and a drain electrode of the third transistor is connected to a source electrode of the sixth transistor; a gate electrode of the fourth transistor is electrically connected to the gate line, a source electrode of the fourth transistor is connected to the data voltage on the data line, and a drain electrode of the fourth transistor is connected to the data writing-in node; a gate electrode of the sixth transistor is electrically connected to the light-emitting control line, and a drain electrode of the sixth transistor is electrically connected to an anode of the micro light-emitting diode; a gate electrode of the fifth transistor is electrically connected to the light-emitting control line, a source electrode of the fifth transistor is connected to the reference voltage, and a drain electrode of the fifth transistor is electrically connected to the data writing-in node; a gate electrode of the seventh transistor is electrically connected to the reset terminal, a source electrode of the seventh transistor is connected to the reference voltage, and a drain electrode of the seventh transistor is electrically connected to the data writing-in node; a gate electrode of the first transistor is electrically connected to the reset terminal, a source electrode of the first transistor is connected to the initialization voltage, and a drain electrode of the first transistor is electrically connect to the control node; a gate electrode of the second transistor is electrically connected to the gate line, a source electrode of the second transistor is electrically connected to the control node, and a drain electrode of the second transistor is electrically connected to the drain electrode of the third transistor; a gate electrode of the eighth transistor is electrically connected to the test control terminal, a source electrode of the eighth transistor is electrically connected to the anode of the micro light-emitting diode, and a drain electrode of the eighth transistor is electrically connected to a cathode of the micro light-emitting diode; the cathode of the micro light-emitting diode is connected to the low voltage.

An embodiment of the present disclosure provides a display device including the display substrate.

DETAILED DESCRIPTION

The technical solutions in the embodiments of the present disclosure will be clearly and completely described below with reference to the accompanying drawings in the embodiments of the present disclosure. Obviously, the described embodiments are only a portion of the embodiments of the present disclosure, but not all of the embodiments. Based on the embodiments in the present disclosure, all other embodiments obtained by those of ordinary skill in the art without creative efforts shall fall within the protection scope of the present disclosure.

The transistors used in all the embodiments of the present disclosure may be triodes, thin film transistors, field effect transistors, or other devices with the same characteristics. In the embodiments of the present disclosure, in order to distinguish the two electrodes of the transistor other than the control electrode, one electrode is called the first electrode, and the other electrode is called the second electrode.

In actual operation, when the transistor is a triode, the control electrode may be the base electrode, the first electrode may be the collector, and the second electrode may be the emitter; or the control electrode may be the base electrode, the first electrode can be an emitter, and the second electrode can be a collector.

In actual operation, when the transistor is a thin film transistor or a field effect transistor, the control electrode may be a gate electrode, the first electrode may be a drain electrode, and the second electrode may be a source electrode. The control electrode may be a gate electrode, the first electrode may be a source electrode, and the second electrode may be a drain electrode.

Figure 1:
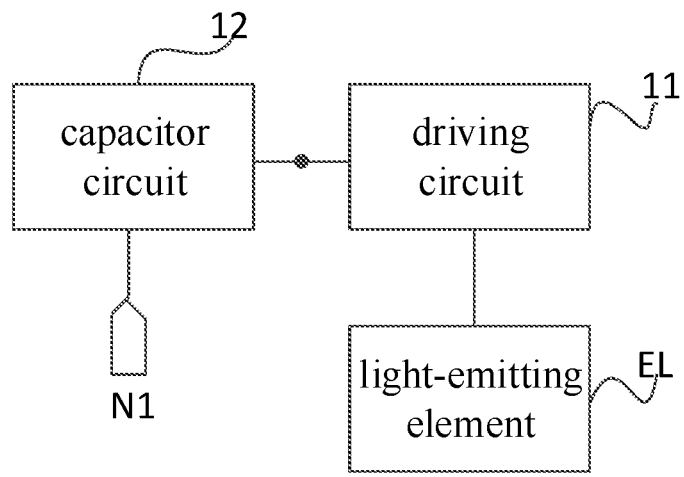
FIG. 1 is a structural diagram of a pixel circuit in a display substrate according to an embodiment of the present disclosure.

The display substrate described in the embodiment of the present disclosure includes a pixel circuit arranged on a base substrate. As shown in FIG. 1, the pixel circuit includes a light-emitting element EL, a driving circuit 11 and a capacitor circuit 12, wherein, The driving circuit 11 is electrically connected to the light-emitting element EL, and configured to drive the light-emitting element EL to emit light;

A first terminal of the capacitor circuit 12 is electrically connected to a control terminal of the driving circuit 11, and a second terminal of the capacitor circuit 12 is electrically connected to a data writing-in node N1;

The capacitor circuit 12 includes at least two capacitors connected in parallel with each other.

According to the calculation formula of capacitance, although the thickness of the second gate insulating layer can also be reduced and the material of the second gate insulating layer can be changed to a material with a larger dielectric constant to increase the capacitance value of the capacitor circuit, the above two methods are different to achieve. In contrast, in the display substrate described in the embodiment of the present disclosure, the capacitor circuit 12 includes at least two capacitors connected in parallel with each other, so as to increase the capacitance value of the capacitor circuit under the existing clock frequency, the voltage of the control terminal of the driving circuit 11 is increased, thereby increasing the gate-source voltage of the driving transistor included in the driving circuit 11, thereby increasing the driving current flowing through the light-emitting element EL, and improving the brightness of the light-emitting element EL. In the embodiment of the present disclosure, the light-emitting element EL may be a Micro LED, but it is not limited thereto.

In actual operation, the light emitting element EL may also be an organic light emitting diode or a mini light emitting diode, but not limited thereto.

Figure 2:
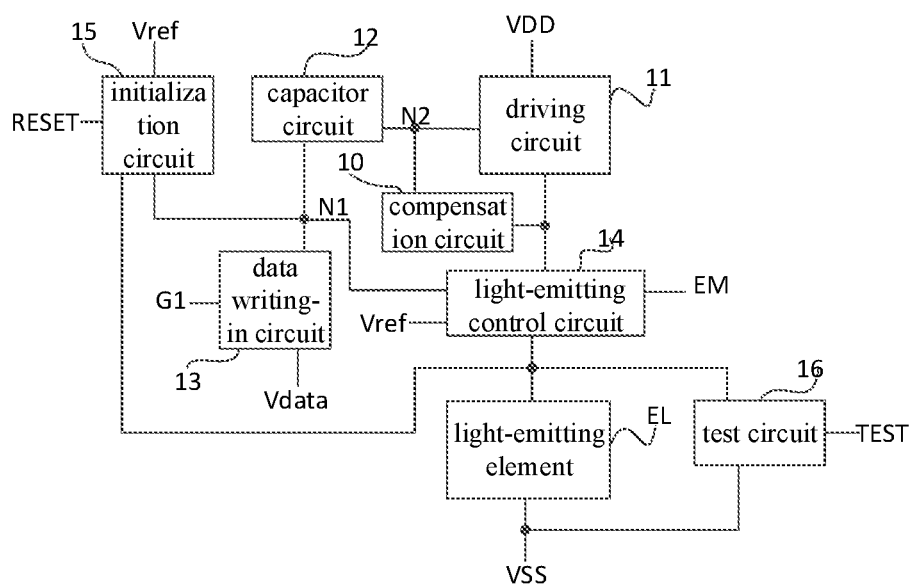
FIG. 2 is a structural block diagram of the pixel circuit according an embodiment of the present disclosure.

In specific implementation, as shown in FIG. 2, on the basis of the embodiment of the pixel circuit shown in FIG. 1, the pixel circuit may further include a compensation circuit 10, a data writing-in circuit 13, a light-emitting control circuit 14, an initialization circuit 15 and a test circuit 16;

A first terminal of the driving circuit 11 is connected to a power supply voltage VDD;

The data writing-in circuit 13 is electrically connected to a gate line G1, a data line and a data writing-in node N1, and is configured to write the data voltage Vdata on the data line into the data writing-in node N1 under the control of the gate driving signal provided by the gate line G1;

The light-emitting control circuit 14 is electrically connected to a light-emitting control line EM, a second terminal of the driving circuit 11, a first electrode of the light-emitting element EL, the data writing-in node N1 and a reference voltage input terminal, is configured to connect the second terminal of the driving circuit 11 and the first electrode of the light-emitting element EL under the control of the light-emitting control signal provided by the light-emitting control line EM, and write the reference voltage Vref into the data writing-in node N1; the reference voltage input terminal is used to input the reference voltage Vref;

A second electrode of the light-emitting element EL is connected to the low voltage VSS;

The initialization circuit 15 is electrically connected to a reset terminal RESET, the reference voltage input terminal, an initialization voltage terminal, the data writing-in node N1 and the second terminal of the driving circuit 11, and is configured to write the reference voltage Vref into the data writing-in node N1 under the control of the reset control signal provided by the reset terminal RESET, and write the initialization voltage Vint into the control terminal of the driving circuit 11; the initialization voltage terminal is used to provide the initialization voltage Vint;

The compensation circuit 10 is electrically connected to the gate line G1, a control terminal of the driving circuit 11 and the second terminal of the driving circuit 11, and is configured to connect the control terminal of the driving circuit 11 and the second terminal of the driving circuit 11 under the control of the gate driving signal;

The test circuit 16 is electrically connected to a test control terminal TEST, the first electrode of the light-emitting element EL and the second electrode of the light-emitting element EL, is configured to connect the first electrode of the light-emitting element EL and the second electrode of the light-emitting element EL under the control of the test control signal provided by the test control terminal TEST.

In the embodiment shown in FIG. 2, the control node N2 is electrically connected to the control terminal of the driving circuit 11.

In the embodiment of the present disclosure, the first electrode of the light-emitting element EL may be an anode, and the second electrode of the light-emitting element EL may be a cathode, but not limited thereto.

Figure 3:
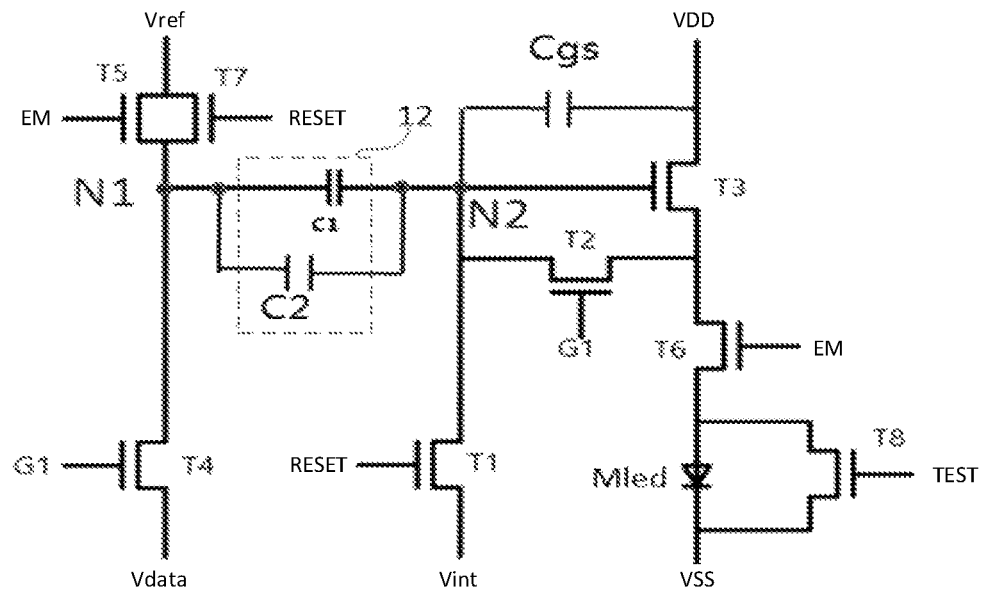
FIG. 3 is a circuit diagram of the pixel circuit according an embodiment of the present disclosure.

As shown in FIG. 3, on the basis of the embodiment of the pixel circuit shown in FIG. 2, in a specific embodiment of the pixel circuit, the driving circuit may include a driving transistor T3, and the capacitor circuit 12 may include a first capacitor C1 and a second capacitor C2 connected in parallel with each other; the data writing-in circuit may include a data writing-in transistor T4; the light-emitting control circuit may include a first light-emitting control transistor T6 and a second light-emitting control transistor T5; the initialization circuit may include a reset transistor T7 and an initialization transistor T1; the compensation circuit may include a compensation transistor T2; the test circuit may include a test transistor T8; the light-emitting element may be a Micro LED Mled;

A first terminal of C1 is electrically connected to a first terminal of C2, and a second terminal of C1 is electrically connected to a second terminal of C2;

The first terminal of C1 is electrically connected to the control node N2, and a second terminal of C2 is electrically connected to the data writing-in node N1;

A gate electrode of T3 is electrically connected to N2, a source electrode of T3 is connected to VDD, and a drain electrode of T3 is electrically connected to a source electrode of T6;

A gate electrode of T4 is electrically connected to G1, a source electrode of T4 is connected to Vdata, and a drain electrode of T4 is electrically connected to N1;

A gate electrode of T6 is electrically connected to EM, and a drain electrode of T6 is electrically connected to an anode of Mled;

A gate electrode of T5 is electrically connected to EM, a source electrode of T5 is connected to Vref, and a drain electrode of T5 is electrically connected to N1;

A gate electrode of T7 is electrically connected to RESET, a source electrode of T7 is connected to Vref, and a drain electrode of T7 is electrically connected to N1;

A gate electrode of T1 is electrically connected to RESET, a source electrode of T1 is connected to Vint, and a drain electrode of T1 is electrically connected to N2;

A gate electrode of T2 is electrically connected to G1, a source electrode of T2 is connected to N2, and a drain electrode of T2 is electrically connected to the drain electrode of T3;

A gate electrode of T8 is electrically connected to TEST, a source electrode of T8 is electrically connected to the anode of Mled, and a drain electrode of T8 is electrically connected to a cathode of Mled;

The cathode of Mled is connected to a low voltage VSS.

In the specific embodiment shown in FIG. 3, when the pixel circuit is in operation, the driving current I flowing through Mled can be equal to $A(Vgs-Vth)^2$; wherein, Vth is the threshold voltage of T3, and Vgs is the gate-source voltage of T3, A is the current parameter of T3, it can be known that the driving current I is affected by the gate-source voltage of T3.

In FIG. 3, the reference number Cgs is a gate-source parasitic capacitor of the driving transistor T3.

During specific implementation, the capacitor circuit may not only include two capacitors connected in parallel, but may also include more capacitors connected in parallel.

In the embodiment of the present disclosure, the capacitor circuit includes at least two capacitors connected in parallel with each other, so that the capacitance value of the capacitor circuit can be increased, and the time constant can also be increased. Therefore, the bootstrap voltage of N2 can be correspondingly increased, which can further increase the current flowing through the Mled and increases the brightness of the Mled.

Figure 4:
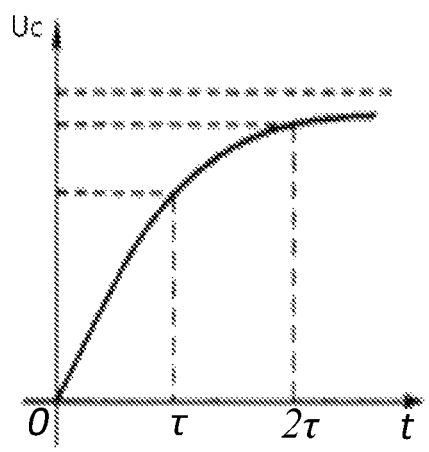
FIG. 4 is a schematic diagram of a relationship between the bootstrap voltage Uc and the time constant t.

As shown in FIG. 4, the horizontal axis is the time constant t, and the vertical axis is the bootstrap voltage Uc of the capacitor circuit. When the time constant changes from t to 2x, it can be seen from FIG. 4 that the bootstrap voltage is increased accordingly.

In the specific implementation, the bootstrap effect of the capacitor refers to that by using the characteristic that the voltage across the capacitor cannot be abruptly changed, when there is a certain voltage across the capacitor, a voltage at the second terminal of the capacitor is increased, and an initial voltage difference to the first terminal of the capacitor is remained as the same, which is equivalent to the voltage of the first terminal of the capacitor being lifted by a negative terminal.

In the embodiment of the present disclosure, the design of the capacitance value of the capacitor circuit is related to the resolution, refresh rate and characteristics of the thin film transistor (TFT) of the display product. Under the condition that the charging rate is satisfied, the larger the capacitance value of the capacitor circuit is, the better the hold characteristic of the gate voltage of the driving transistor is, and the more stable the driving current is. In the circuit design with high requirements on the driving current, the influence of the gate-source parasitic capacitor Cgs of the driving transistor should also be considered. In order to ensure a stable voltage of N2, a ratio between the capacitance value of the capacitor circuit to the gate-source parasitic capacitor Cgs is greater than a predetermined ratio. Since the thickness and structure of each film layer constituting the display pattern under the related art process route have been determined, in the present disclosure, the capacitance value of the capacitor circuit is increased by increasing the facing area between the electrodes included in the capacitor.

The formula for calculating the capacitance value of the capacitor is as follows: $C=\varepsilon S/(4\pi kd)$, where $\varepsilon$ is the dielectric constant of a medium between the electrode plates, S is a facing area between the electrodes included in the capacitor, and d is a distance between the two electrodes included in the capacitor, k is the Boltzmann constant. It can be known from the calculation formula that the capacitance value of the capacitor can be increased by increasing the facing area between the electrodes included in the capacitor.

According to a specific implementation manner, the display substrate may include a first conductive layer, a first insulating layer, a second conductive layer, a second insulating layer and a third conductive layer sequentially arranged on the base substrate; the capacitor circuit includes a first electrode, a second electrode, a third electrode, a first insulating portion, a second insulating portion and a third insulating portion;

The first electrode is formed by the first conductive layer, the second electrode is formed by the second conductive layer, the third electrode is formed by the third conductive layer, and the first insulating portion is formed by the first insulating layer, the second insulating portion and the third insulating portion are formed by the second insulating layer;

The first electrode, the first insulating portion and the second electrode constitute a first capacitor included in the capacitor circuit, and the second electrode, the second insulating portion and the third electrode constitute the second capacitor included in the capacitor circuit;

An orthographic projection of the first electrode on the base substrate, an orthographic projection of the first insulating portion on the base substrate, and an orthographic projection of the second electrode on the base substrate at least partially overlap; an orthographic projection of the second electrode on the base substrate, an orthographic projection of the second insulating portion on the base substrate, and an orthographic projection of the third electrode on the base substrate at least partially overlap;

The first electrode is electrically connected to the third electrode through a first conductive connection portion, and the first conductive connection portion is arranged in a first via hole penetrating through the first insulating layer, the second conductive layer and the second insulating layer, the third insulating portion is arranged between the first conductive connection portion and the second electrode.

In a specific implementation, the capacitor circuit may include a first capacitor and a second capacitor connected in parallel with each other, and the capacitor circuit includes a first electrode, a second electrode, a third electrode, a first insulating portion, a second insulating portion, and a third insulating portion, and it is necessary to ensure that the orthographic projection of the first electrode on the base substrate, the orthographic projection of the first insulating portion on the base substrate, and the orthographic projection of the second electrode on the base substrate at least partially overlap, and it is necessary to ensure that the orthographic projection of the second electrode on the base substrate, the orthographic projection of the second insulating portion on the base substrate, and the orthographic projections of the third electrode on the base substrate at least partially overlap, so that the first electrode, the first insulating portion and the second electrode constitute a first capacitor included in the capacitor circuit, and the second electrode, the second insulating portion and the third electrode constitute a second capacitor included in the capacitor circuit.

In addition, in the embodiment of the present disclosure, the first electrode is electrically connected to the third electrode through a first conductive connection portion, and the first conductive connection portion is arranged in the first via hole penetrating through the first insulating layer, the second conductive layer and the second insulating layer, the third insulating portion is arranged between the first conductive connection portion and the second electrode, so that there is a first facing area between the first electrode and the second electrode, there is a second facing area between the second electrode and the third electrode, and there is a third facing area between the first conductive connection portion and the second electrode, which can improve the capacitance value of the capacitor circuit.

According to another specific embodiment, the display substrate may include a first conductive layer, a first insulating layer, a second conductive layer, a second insulating layer and a third conductive layer that are sequentially arranged on the base substrate; the capacitor circuit includes a first electrode, a second electrode, a third electrode, a first insulating portion, a second insulating portion, a third insulating portion and a fourth insulating portion;

The first electrode is formed by the first conductive layer, the second electrode is formed by the second conductive layer, the third electrode is formed by the third conductive layer, and the first insulating portion is formed by the first insulating layer, the second insulating portion, the third insulating portion and the fourth insulating portion are formed by the second insulating layer;

The first electrode, the first insulating portion and the second electrode constitute a first capacitor included in the capacitor circuit, and the second electrode, the second insulating portion and the third electrode constitute the second capacitor included in the capacitor circuit;

The orthographic projection of the first electrode on the base substrate, the orthographic projection of the first insulating portion on the base substrate, and the orthographic projection of the second electrode on the base substrate at least partially overlap; the orthographic projection of the second electrode on the base substrate, the orthographic projection of the second insulating portion on the base substrate, and the orthographic projection of the third electrode on the base substrate at least partially overlap;

The first electrode is electrically connected to the third electrode through a first conductive connection portion, and the first conductive connection portion is arranged in the first via hole penetrating through the first insulating layer, the second conductive layer and the second insulating layer, the third insulating portion is arranged between the first conductive connection portion and the second electrode;

The first electrode is also electrically connected to the third electrode through a second conductive connection portion, and the second conductive connection portion is arranged in a second via hole penetrating through the first insulating layer, the second conductive layer and the second insulating layer, a fourth insulating portion is arranged between the second conductive connection portion and the second electrode.

In a specific implementation, the capacitor circuit may include a first capacitor and a second capacitor connected in parallel with each other, and the capacitor circuit includes a first electrode, a second electrode, a third electrode, a first insulating portion, a second insulating portion, a third insulating parts and a fourth insulating portion, and it is necessary to ensure the orthographic projection of the first electrode on the base substrate, the orthographic projection of the first insulating portion on the base substrate, and the orthographic projection of the second electrode on the base substrate at least partially overlap, and it is necessary to ensure that the orthographic projection of the second electrode on the base substrate, the orthographic projection of the second insulating portion on the base substrate and the orthographic projection of the third electrode on the base substrate at least partially overlap, so that the first electrode, the first insulating portion and the second electrode constitute a first capacitor included in the capacitor circuit, the second electrode, the second insulating portion and the third electrode constitute a second capacitor included in the capacitor circuit.

Moreover, in the embodiment of the present disclosure, the first electrode is electrically connected to the third electrode through a first conductive connection portion, and the first electrode is also electrically connected to the third electrode through a second conductive connection portion, the third insulating portion is arranged between the first conductive connection portion and the second electrode, and the fourth insulating portion is arranged between the second conductive connection portion and the second electrode. In this way, there is a first facing area between the first electrode and the second electrode, there is a second facing area between the second electrode and the third electrode, and there is a third facing area between the first conductive connection portion and the second electrode, there is a fourth facing area between the second conductive portion and the second electrode, which can improve the capacitance value of the capacitor circuit.

In a specific implementation, the first conductive connection portion may be arranged on a first side of the second electrode, the second conductive connection portion may be arranged on a second side of the second electrode, and the first side is opposite to the second side, but not limited thereto.

For example, the first conductive connection portion may be arranged on the left side of the second electrode, and the second conductive connection portion may be arranged on the right side of the second electrode, but not limited thereto.

In the embodiment of the present disclosure, the first conductive layer is a first gate metal layer, the second conductive layer is a second gate metal layer, the third conductive layer is a source-drain metal layer, and the first insulating layer is a second gate insulating layer, and the second insulating layer is an interlayer dielectric layer; or, The first conductive layer is a portion of the active layer that is a conductor, the second conductive layer is the first gate metal layer, the third conductive layer is the second gate metal layer, and the first insulating layer is a first gate insulating layer, and the second insulating layer is a second gate insulating layer.

The structure of the capacitor circuit in the display substrate described in the present disclosure will be described below through specific embodiments.

Figure 5:
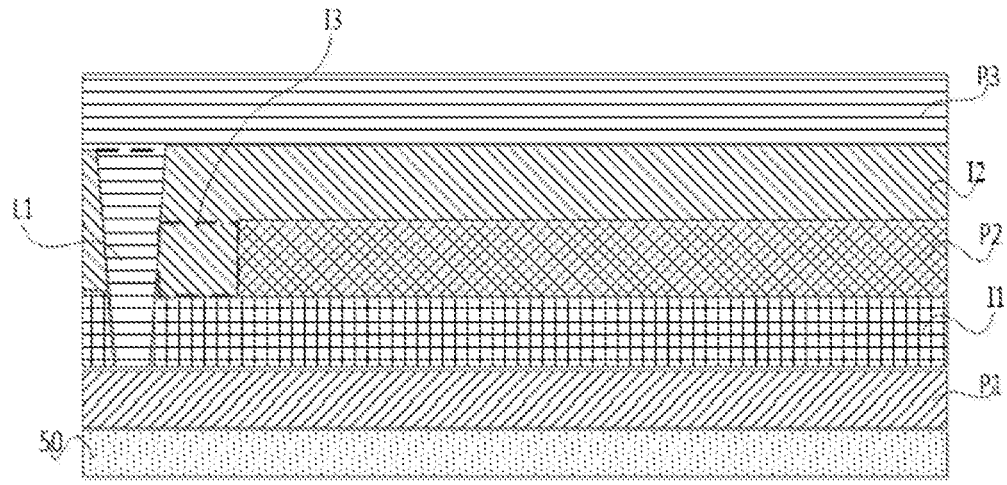
FIG. 5 is a structural diagram of a capacitor circuit in a display substrate according to an embodiment of the present disclosure.

In one embodiment, as shown in FIG. 5, the display substrate may include a first gate metal layer, a second gate insulating layer, a second gate metal layer, an interlayer dielectric layer and a source-drain metal layer which are sequentially arranged on the base substrate 50 in order from the base substrate 50 to the farthest, as shown in FIG. 5;

In the embodiment shown in FIG. 5, the capacitor circuit may include a first electrode P1, a second electrode P2, a third electrode P3, a first insulating portion I1, a second insulating portion I2, and a third insulating portion I3;

The first electrode P1 is formed by the first gate metal layer, the second electrode P2 is formed by the second gate metal layer, the third electrode P3 is formed by the source-drain metal layer, the first insulating portion I1 is formed by the second gate insulating layer, and the second insulating portion I2 and the third insulating portion I3 are formed by the interlayer dielectric layer;

The at least two capacitors connected in parallel include a first capacitor and a second capacitor. The first electrode P1, the first insulating portion I1 and the second electrode P2 constitute the first capacitor, and the second electrode P2, the second insulating portion I2 and the third electrode P3 constitute the second capacitor;

The orthographic projection of the first electrode P1 on the base substrate 50, the orthographic projection of the first insulating portion I1 on the base substrate 50, and the orthographic projection of second electrode P2 on the base substrate 50 at least partially overlap; the orthographic projection of the second electrode P2 on the base substrate 50, the orthographic projection of the second insulating portion I2 on the base substrate 50 and the orthographic projection of the third electrode P2 on the base substrate 50 at least partially overlap;

The first electrode P1 is electrically connected to the third electrode P3 through a first conductive connection portion L1, and the first conductive connection portion L1 is arranged in the first via hole penetrating through the second gate insulating layer, the second gate metal layer and the interlayer dielectric layer, the third insulating portion I3 is arranged between the first conductive connection portion L1 and the second electrode P2.

As shown in FIG. 5, the capacitor circuit includes a first capacitor and a second capacitor connected in parallel with each other, there is a first facing area S1 between the first electrode P1 and the second electrode P2, and there is a second facing area S2 between the second electrode P2 and the third electrode P3, and there is a third facing area S3 between the first conductive connection portion L1 and the second electrode P2, which can increase the capacitance value of the capacitor circuit.

In the embodiment shown in FIG. 5, the structure of the capacitor circuit is a sandwich capacitor structure.

In the embodiment shown in FIG. 5, the first conductive layer is the first gate metal layer, the second conductive layer is the second gate metal layer, the third conductive layer is the source-drain metal layer, and the first insulating layer is the second gate insulating layer, the second insulating layer is an interlayer dielectric layer.

Figure 6:
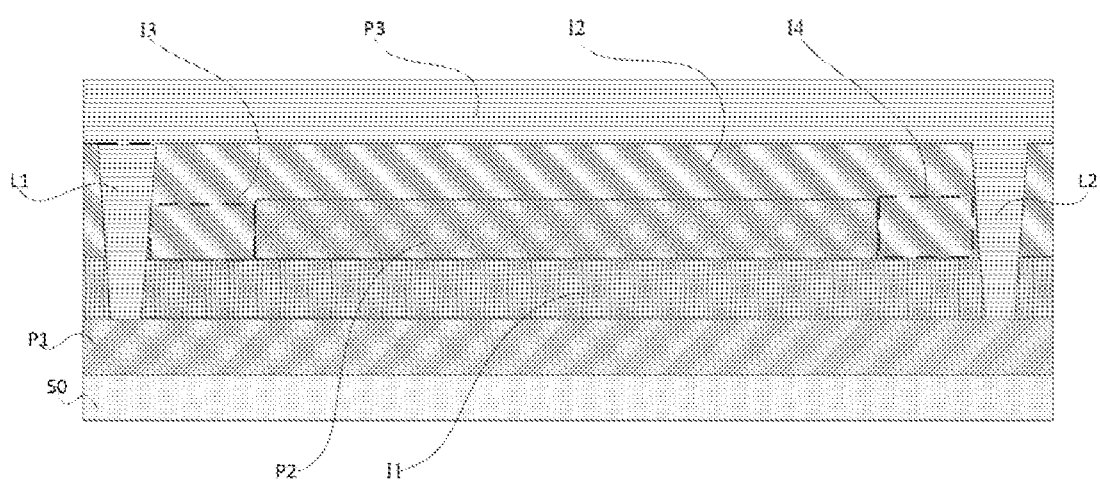
FIG. 6 is another structural diagram of the capacitor circuit in the display substrate according to the embodiment of the present disclosure.

In another embodiment, as shown in FIG. 6, the display substrate may include a first gate metal layer, a second gate insulating layer, a second gate metal layer, an interlayer dielectric layer and a source-drain metal layer, which are sequentially arranged on the base substrate 50 in order from the base substrate 50 to the farthest;

In the embodiment shown in FIG. 6, the capacitor circuit may include a first electrode P1, a second electrode P2, a third electrode P3, a first insulating portion I1, a second insulating portion I2, a third insulating portion I3 and a fourth insulating portion I4;

The first electrode P1 is formed by the first gate metal layer, the second electrode P2 is formed by the second gate metal layer, the third electrode P is formed by the source-drain metal layer, and the first insulating portion I1 is formed by the second gate insulating layer, and the second insulating portion I2, the third insulating portion I3 and the fourth insulating portion I4 are all formed by the interlayer dielectric layer;

The first electrode P1, the first insulating portion I1 and the second electrode P2 constitute a first capacitor included in the capacitor circuit, and the second electrode P2, the second insulating portion I2 and the third electrodes P2 constitute the second capacitor included in the capacitor circuit;

The orthographic projection of the first electrode P1 on the base substrate 50, the orthographic projection of the first insulating portion I1 on the base substrate 50, and the orthographic projection of the second electrode P2 on the base substrate 50 at least partially overlap; the orthographic projection of the second electrode P2 on the base substrate 50, the orthographic projection of the second insulating portion I2 on the base substrate 50 and the orthographic projection of the third electrode P3 on the base substrate 50 at least partially overlap;

The first electrode P1 is electrically connected to the third electrode P3 through a first conductive connection portion L1, and the first conductive connection portion L1 is arranged in the first via hole penetrating through the second gate insulating layer, the second gate metal layer and the second gate insulating layer, the third insulating portion I3 is arranged between the first conductive connection portion L1 and the second electrode P2;

The first electrode P1 is also electrically connected to the third electrode P3 through a second conductive connection portion L2, and the second conductive connection portion L2 is arranged in the second via hole penetrating through the first insulating layer, the second conductive layer and the second insulating layer, the fourth insulating portion I2 is arranged between the second conductive connection portion L2 and the second electrode P2.

As shown in FIG. 6, the capacitor circuit includes a first capacitor and a second capacitor connected in parallel with each other, there is a first facing area S1 between the first electrode P1 and the second electrode P2, and there is a second facing area S2 between the second electrode P2 and the third electrode P3, there is a third facing area S3 between the first conductive connecting portion L1 and the second electrode P2, and there is a fourth facing area S4 between the second conductive connecting portion L2 and the second electrode P2, which can increase the capacitance value of the capacitance circuit.

In the embodiment shown in FIG. 6, the structure of the capacitor circuit is a wrap-around capacitor structure.

In the embodiment shown in FIG. 6, the first conductive layer is the first gate metal layer, the second conductive layer is the second gate metal layer, the third conductive layer is the source-drain metal layer, and the first insulating layer is the second gate insulating layer, the second insulating layer is an interlayer dielectric layer.

In FIGS. 5 and 6, an active layer and a first gate insulating layer may also be arranged between the base substrate 10 and the first gate metal layer.

Figure 7:
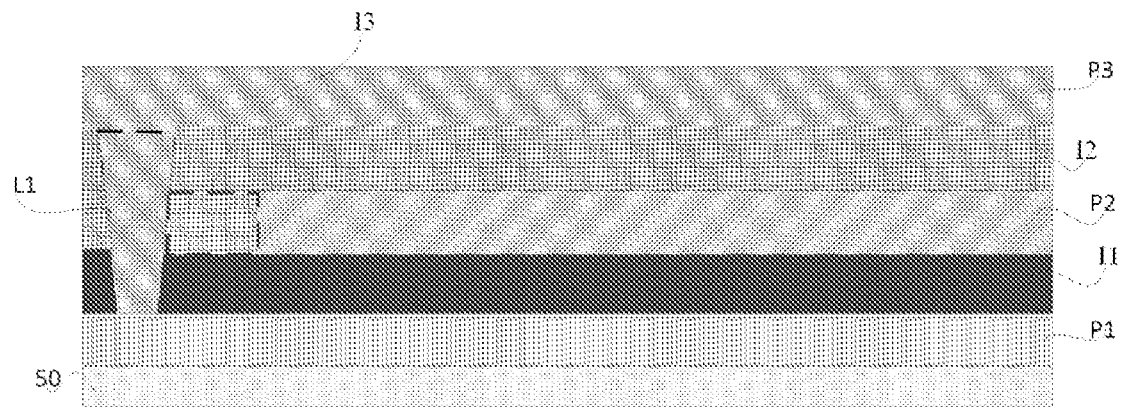
FIG. 7 is yet another structural diagram of the capacitor circuit in the display substrate according to the embodiment of the present disclosure.

As shown in FIG. 7, the display substrate may include an active layer, a first gate insulating layer, a first gate metal layer, a second gate insulating layer and a second gate metal layer that are sequentially arranged on the base substrate 50 in an order from the base substrate 50 to the farthest;

In the embodiment shown in FIG. 7, the capacitor circuit includes a first electrode P1, a second electrode P2, a third electrode P3, a first insulating portion I1, a second insulating portion I2 and a third insulating portion I3;

The first electrode P1 is formed by a portion of the active layer that is conductor, the second electrode P2 is formed by the first gate metal layer, and the third electrode P3 is formed by the second gate metal layer, the first insulating portion I1 is formed by the first gate insulating layer, and the second insulating portion I2 and the third insulating portion I3 are both formed by the second gate insulating layer;

The first electrode P1, the first insulating portion I1 and the second electrode P2 constitute a first capacitor included in the capacitor circuit, and the second electrode P2, the second insulating portion I2 and the third electrode P3 constitute the second capacitor included in the capacitor circuit;

The orthographic projection of the first electrode P1 on the base substrate 50, the orthographic projection of the first insulating portion I1 on the base substrate 50, and the orthographic projection of the second electrode P2 on the base substrate 50 at least partially overlap; the orthographic projection of the second electrode P2 on the base substrate 50, the orthographic projection of the second insulating portion I2 on the base substrate 50 and the orthographic projections of the third electrode P2 on the base substrate 50 at least partially overlap;

The first electrode P1 is electrically connected to the third electrode P3 through a first conductive connection portion L1, and the first conductive connection portion L1 is arranged in the first via hole penetrating through the first gate insulating layer, the first gate metal layer and the second gate insulating layer, the third insulating portion I3 is arranged between the first conductive connection portion L1 and the second electrode P2.

As shown in FIG. 7, the capacitor circuit includes a first capacitor and a second capacitor connected in parallel with each other, there is a first facing area S1 between the first electrode P1 and the second electrode P2, there is a second facing area S2 between the second electrode P2 and the third electrode P3, and there is a third facing area S3 between the first conductive connection portion L1 and the second electrode P2, which can increase the capacitance value of the capacitor circuit.

In the embodiment shown in FIG. 7, the structure of the capacitor circuit is a sandwich capacitor structure.

In the embodiment shown in FIG. 7, the first conductive layer is a portion of the active layer which is a conductor, the first conductive layer is the first gate metal layer, the second conductive layer is the second gate metal layer, and the first insulating layer is a first gate insulating layer, and the second insulating layer is a second gate dielectric layer.

In the embodiment shown in FIG. 7, since the thickness of the first gate insulating layer and the thickness of the second gate insulating layer are relatively small, the capacitance value of the capacitor circuit can be made larger.

Figure 8:
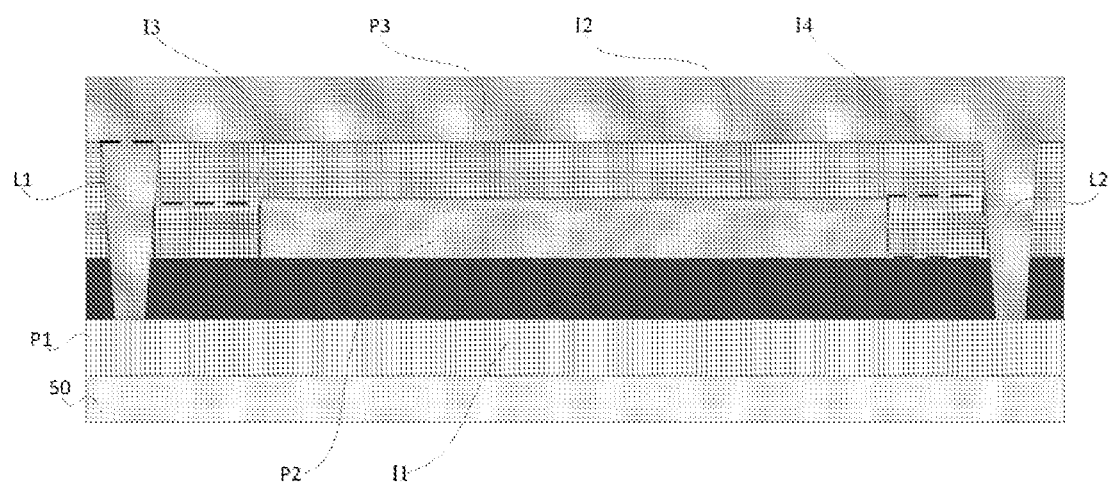
FIG. 8 is still yet another structural diagram of the capacitor circuit in the display substrate according to the embodiment of the present disclosure.

As shown in FIG. 8, the display substrate may include an active layer, a first gate insulating layer, a first gate metal layer, a second gate insulating layer and a second gate metal layer, which are sequentially arranged on the base substrate 50 in an order from the base substrate 50 to the farthest;

In the specific embodiment shown in FIG. 8, the capacitor circuit may include a first electrode P1, a second electrode P2, a third electrode P3, a first insulating portion I1, a second insulating portion I2, a third insulating portion I3 and the fourth insulating portion I4;

The first electrode P1 is formed by a portion of the active layer that is a conductor, the second electrode P2 is formed by the first gate metal layer, and the third electrode P3 is formed by the second gate metal layer, the first insulating portion I1 is formed by the first gate insulating layer, and the second insulating portion I2, the third insulating portion I3 and the fourth insulating portion I4 are all formed by the second gate insulating layer;

The first electrode P1, the first insulating portion I1 and the second electrode P2 constitute a first capacitor included in the capacitor circuit, and the second electrode P2, the second insulating portion I2 and the third electrode P3 constitute the second capacitor included in the capacitor circuit;

The orthographic projection of the first electrode P1 on the base substrate 50, the orthographic projection of the first insulating portion I1 on the base substrate 50, and the orthographic projection of the second electrode P2 on the base substrate 50 at least partially overlap; the orthographic projection of the second electrode P2 on the base substrate 50, the orthographic projection of the second insulating portion I2 on the base substrate 50 and the orthographic projection of the third electrode P3 on the base substrate 50 at least partially overlap;

The first electrode P1 is electrically connected to the third electrode P3 through a first conductive connection portion L1, and the first conductive connection portion L1 is arranged in the first via hole penetrating through the first gate insulating layer, the first gate metal layer and the second gate insulating layer, the third insulating portion I3 is arranged between the first conductive connection portion L1 and the second electrode P2;

The first electrode P1 is also electrically connected to the third electrode P3 through a second conductive connection portion L2, and the second conductive connection portion L2 is arranged in the second via hole penetrating through the first insulating layer, the second conductive layer and the second insulating layer, the fourth insulating portion I2 is arranged between the second conductive connection portion L2 and the second electrode P2.

As shown in FIG. 8, the capacitor circuit includes a first capacitor and a second capacitor connected in parallel with each other, there is a first facing area S1 between the first electrode P1 and the second electrode P2, and there is a second facing area S2 between the second electrode P2 and the third electrode P3, there is a third facing area S3 between the first conductive connecting portion L1 and the second electrode P2, and there is a fourth facing area S4 between the second conductive connecting portion L2 and the second electrode P2, which can increase the capacitance value of the capacitance circuit.

In the embodiment shown in FIG. 8, the structure of the capacitor circuit is a wrap-around capacitor structure.

In the embodiment shown in FIG. 8, the first conductive layer is a portion of the active layer that is a conductor, the first conductive layer is the first gate metal layer, the second conductive layer is the second gate metal layer, and the first insulating layer is the first gate insulating layer, and the second insulating layer is a second gate dielectric layer.

According to yet another specific embodiment, the display substrate includes a first conductive layer, a first insulating layer, a second conductive layer, a second insulating layer, a third conductive layer, a third insulating layer and a fourth conductive layer, which are sequentially arranged on the base substrate;

The capacitor circuit includes a first electrode, a second electrode, a third electrode, a fourth electrode, a first insulating portion, a second insulating portion, a third insulating portion, a fourth insulating portion, and a fifth insulating portion;

The first electrode is formed by the first conductive layer, the second electrode is formed by the second conductive layer, the third electrode is formed by the third conductive layer, and the fourth electrode is formed by a fourth conductive layer;

The first insulating portion is formed by a first insulating layer, the second insulating portion is formed by a second insulating layer, the third insulating portion is formed by the third insulating layer, the fourth insulating portion is formed by the third insulating layer, and the fifth insulating portion is formed by the second insulating layer;

The first electrode, the first insulating portion and the second electrode constitute a first capacitor included in the capacitor circuit, and the second electrode, the second insulating portion and the third electrode constitute the second capacitor included in the capacitor circuit, the third electrode, the third insulating portion and the fourth electrode constitute a third capacitor included in the capacitor circuit;

The orthographic projection of the first electrode on the base substrate, the orthographic projection of the first insulating portion on the base substrate, and the orthographic projection of the second electrode on the base substrate at least partially overlap; the orthographic projection of the second electrode on the base substrate, the orthographic projection of the second insulating portion on the base substrate, and the orthographic projection of the third electrode on the base substrate at least partially overlap; the orthographic projection of the third electrode on the base substrate, the orthographic projection of the third insulating portion on the base substrate, and the orthographic projection of the fourth electrode on the base substrate at least partially overlap;

The first electrode is electrically connected to the third electrode through a third conductive connection portion, and the third conductive connection portion is arranged in a third via hole penetrating through the first gate insulating layer, the first gate metal layer and the second gate insulating layer; a fifth insulating portion is arranged between the third conductive connection portion and the second electrode;

The second electrode is electrically connected to the fourth electrode through a fourth conductive connection portion, and the fourth conductive connection portion is arranged in a fourth via hole penetrating through the second gate insulating layer, the second gate metal layer and the interlayer dielectric layer, the fourth insulating portion is arranged between the fourth conductive connection portion and the third electrode.

In a specific implementation, the capacitor circuit may include a first capacitor, a second capacitor, and a third capacitor connected in parallel with each other, and the capacitor circuit includes a first electrode, a second electrode, a third electrode, a fourth electrode, a first insulation portion, a second insulating portion, a third insulating portion, a fourth insulating portion and a fifth insulating portion, and it is necessary to ensure the orthographic projection of the first electrode on the base substrate, the orthographic projection of the first insulating portion on the base substrate and the orthographic projection of the second electrode on the base substrate at least partially overlap, and it is necessary to ensure that the orthographic projection of the second electrode on the base substrate, the orthographic projection of the second insulating portion on the base substrate and the orthographic projection of the third electrode on the base substrate at least partially overlap, and it is necessary to ensure that the orthographic projection of the third electrode on the base substrate, the orthographic projection of the third insulating portion on the base substrate and the orthographic projection of the fourth electrode on the base substrate at least partially overlap, so that the first electrode, the first insulating portion and the second electrode constitute a first capacitor included in the capacitor circuit, and the second electrode, the second insulating portion, and the third electrode constitute a second capacitor included in the capacitor circuit, the third electrode, the third insulating portion and the fourth electrode constitute a third capacitor included in the capacitor circuit.

In addition, in the embodiment of the present disclosure, the first electrode is electrically connected to the third electrode through a third conductive connection portion, the second electrode is electrically connected to the fourth electrode through a fourth conductive connection portion, and there is the first facing area between the first electrode and the second electrode, there is a second facing area between the second electrode and the third electrode, there is a third facing area between the third electrode and the fourth electrode, and there is a fourth facing area between the third conductive connection portion and the second electrode, and there is a fifth facing area between the fourth conductive connecting portion and the second electrode, which can increase the capacitance value of the capacitor circuit.

Optionally, the third conductive connection portion may be arranged on a first side of the second electrode and the third electrode, and the fourth conductive connection portion may be arranged on a second side of the second electrode and the third electrode, the first side and the second side are opposite sides.

For example, the third conductive connection portion may be arranged on the left side of the second electrode and the third electrode, and the fourth conductive connection portion may be arranged on the right side of the second electrode and the third electrode side, but not limited to this.

In the embodiment of the present disclosure, the first conductive layer is a portion of the active layer that is a conductor, the second conductive layer is a first gate metal layer, the third conductive layer is a second gate metal layer, the fourth conductive layer is a source-drain metal layer; the first insulating layer is a first gate insulating layer, the second insulating layer is a second gate insulating layer, and the third insulating layer is an interlayer dielectric layer, but it is not limited to this.

Figure 9:
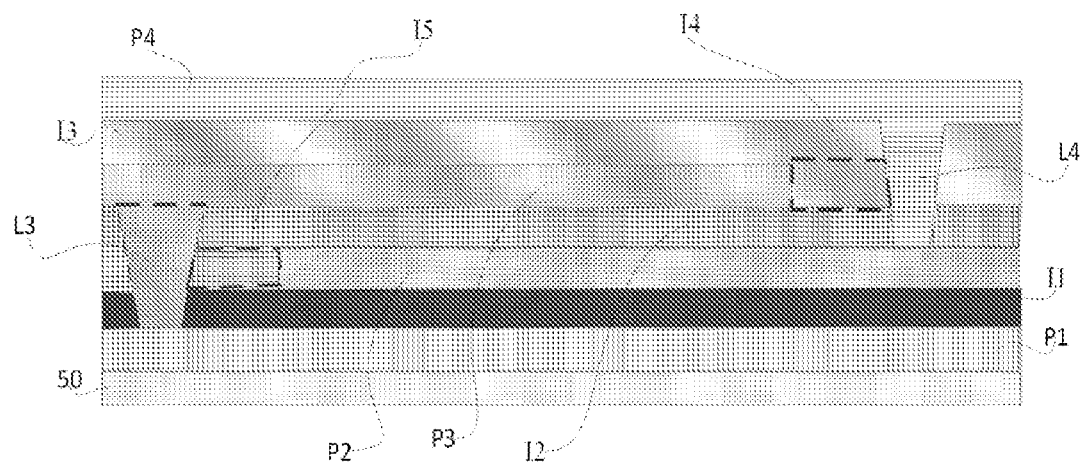
FIG. 9 is still yet another structural diagram of the capacitor circuit in the display substrate according to the embodiment of the present disclosure.

As shown in FIG. 9, the display substrate may include an active layer, a first gate insulating layer, a first gate metal layer, a second gate insulating layer, a second gate metal layer, an interlayer dielectric layer and a source-drain metal layer which are sequentially arranged on the base substrate 50 in order from the base substrate 50 to the farthest;

In the embodiment shown in FIG. 9, the capacitor circuit may include a first electrode P1, a second electrode P2, a third electrode P3, a fourth electrode P4, a first insulating portion I1, a second insulating portion I2, a third electrode an insulating portion I3, a fourth insulating portion I4 and a fifth insulating portion I5;

The first electrode P1 is formed by the portion of the active layer that is a conductor, the second electrode P2 is formed by the first gate metal layer, and the third electrode P3 is formed by the second gate metal layer, the fourth electrode P4 is formed by the source-drain metal layer;

The first insulating portion I1 is formed by a first gate insulating layer, the second insulating portion I2 is formed by the second gate insulating layer, the third insulating portion I2 is formed by the interlayer dielectric layer, and the fourth insulating portion I4 is formed by the interlayer dielectric layer, and the fifth insulating portion I5 is formed by the second gate insulating layer;

The first electrode P1, the first insulating portion IT and the second electrode P2 constitute a first capacitor included in the capacitor circuit, and the second electrode P2, the second insulating portion I2 and the third electrodes P3 constitute the second capacitor included in the capacitor circuit, and the third electrode P3, the third insulating portion I3 and the fourth electrode P4 constitute the third capacitor included in the capacitor circuit;

The orthographic projection of the first electrode P1 on the base substrate 50, the orthographic projection of the first insulating portion IT on the base substrate 50, and the orthographic projections of the second electrode P2 on the base substrate 50 at least partially overlap; the orthographic projection of the second electrode P2 on the base substrate 50, the orthographic projection of the second insulating portion I2 on the base substrate 50 and the orthographic projection of the third electrode P3 on the base substrate 50 at least partially overlaps; the orthographic projection of the third electrode P3 on the base substrate 50, the orthographic projection of the third insulating portion I3 on the base substrate 50 and the orthographic projection of the fourth electrode P4 on the base substrate 50 at least partially overlap;

The first electrode P1 is electrically connected to the third electrode P3 through a third conductive connection portion L3, and the third conductive connection portion L3 is arranged in the third via hole penetrating through the first insulating layer I1, the second conductive layer P2 and the second insulating layer I3; the fifth insulating portion I5 is arranged between the third conductive connection portion L3 and the second electrode P2;

The second electrode P2 is electrically connected to the fourth electrode P4 through a fourth conductive connection portion L4, and the fourth conductive connection portion L4 is arranged in the fourth via hole penetrating through the second insulating layer, the third conductive layer and the third insulating layer, the fourth insulating portion I4 is arranged between the fourth conductive connection portion L4 and the third electrode P3.

As shown in FIG. 9, the capacitor circuit includes a first capacitor, a second capacitor and a third capacitor connected in parallel with each other, there is a first facing area S1 between the first electrode P1 and the second electrode P2, there is a second facing area S2 between the second electrode P2 and the third electrodes P3, there is a third facing area S3 between the third electrode P3 and the fourth electrode P4, and there is the fourth facing area S4 between the third conductive connection portion L3 and the second electrode P2, there is a fifth facing area S5 between the fourth conductive connection portion L4 and the third electrode P3, which can increase the capacitance value of the capacitor circuit.

In the embodiment shown in FIG. 9, the structure of the capacitor circuit is a cross-type four-electrode capacitor structure.

In the embodiment shown in FIG. 9, the first conductive layer is a portion of the active layer that is a conductor, the second conductive layer is a first gate metal layer, and the third conductive layer is a second gate metal layer, the fourth conductive layer is a source-drain metal layer; the first insulating layer is a first gate insulating layer, the second insulating layer is a second gate insulating layer, and the third insulating layer is an interlayer dielectric layer.

According to yet another specific embodiment, the display substrate includes a first conductive layer, a first insulating layer, a second conductive layer, a second insulating layer, a third conductive layer, a third insulating layer and a fourth conductive layer which are sequentially arranged on the base substrate;

The capacitor circuit includes a first electrode, a second electrode, a third electrode, a fourth electrode, a first insulating portion, a second insulating portion, a third insulating portion, a fourth insulating portion, a fifth insulating portion, and a sixth insulating portion;

the second electrode is electrically connected to the third electrode;

The first electrode is formed by the first conductive layer, the second electrode is formed by the second conductive layer, the third electrode is formed by the third conductive layer, and the fourth electrode is formed by the fourth conductive layer;

The first insulating portion is formed by the first insulating layer, the second insulating portion is formed by the third insulating layer, and the third insulating portion and the fifth insulating portion are formed by the second insulating layer, the fourth insulating portion and the sixth insulating portion are formed by the third insulating layer;

The first electrode, the first insulating portion and the second electrode constitute a first capacitor included in the capacitor circuit, and the third electrode, the second insulating portion and the fourth electrode constitute the second capacitor included in the capacitor circuit;

The orthographic projection of the first electrode on the base substrate, the orthographic projection of the first insulating portion on the base substrate, and the orthographic projection of the second electrode on the base substrate at least partially overlap; the orthographic projection of the third electrode on the base substrate, the orthographic projection of the second insulating portion on the base substrate, and the orthographic projection of the fourth electrode on the base substrate at least partially overlap;

The first electrode is electrically connected to the fourth electrode through a fifth conductive connection portion, and the fifth conductive connection portion is arranged in the fifth via hole penetrating through the first insulating layer, the second conductive layer, the second insulating layer, the third conductive layer and the third insulating layer; the third insulating portion is arranged between the fifth conductive connection portion and the second electrode, and the fourth insulating portion is arranged between the fifth conductive connection portion and the third electrode;

The first electrode is also electrically connected to the fourth electrode through a sixth conductive connection portion, and the sixth conductive connection portion is arranged in a sixth via hole penetrating through the first insulating layer, the second conductive layer, the second insulating layer, the third conductive layer and the third insulating layer; the fifth insulating portion is arranged between the sixth conductive connecting portion and the second electrode, and the sixth insulating portion is arranged between the sixth conductive connection portion and the third electrode.

In a specific implementation, the capacitor circuit may include a first capacitor and a second capacitor connected in parallel with each other, and the capacitor circuit includes a first electrode, a second electrode, a third electrode, a fourth electrode, a first insulating portion, a second insulating portion, a third insulating portion, a fourth insulating portion, a fifth insulating portion and a sixth insulating portion, and it is necessary to ensure that the orthographic projection of the first electrode on the base substrate, and the orthographic projection of the first insulating portion on the base substrate and the orthographic projection of the second electrode on the base substrate at least partially overlap, and it is necessary to ensure that the orthographic projection of the third electrode on the base substrate, the orthographic projection of the second insulating portion on the base substrate and the orthographic projection of the fourth electrode on the base substrate at least partially overlap, so that the first electrode, the first insulating portion and the second electrode constitutes a first capacitor included in the capacitor circuit, and the third electrode, the second insulating portion and the fourth electrode constitute a second capacitor included in the capacitor circuit.

Moreover, in the embodiment of the present disclosure, the first electrode is electrically connected to the fourth electrode through a fifth conductive connection portion, and the first electrode is also electrically connected to the fourth electrode through a sixth conductive connection portion, There is a first facing area between the first electrode and the second electrode, there is a second facing area between the third electrode and the fourth electrode, and there is a third facing area between the fifth conductive connection portion and the second electrode, there is a fourth facing area between the fifth conductive connection portion and the third electrode, there is a fifth facing area between the sixth conductive connection portion and the second electrode, and there is a sixth facing area between the sixth conductive connection portion and the third electrode, which can improve the capacitance value of the capacitor circuit.

Optionally, the fifth conductive connection portion is arranged on the first side of the second electrode and the third electrode, and the sixth conductive connection portion is arranged on the second side of the second electrode and the third electrode, the first side and the second side are opposite sides.

For example, the fifth conductive connection portion may be arranged on the left side of the second electrode and the third electrode, and the sixth conductive connection portion may be arranged on the right side of the second electrode and the third electrode side, but not limited to this.

In the embodiment of the present disclosure, the first conductive layer is a portion of the active layer that is a conductor, the second conductive layer is a first gate metal layer, the third conductive layer is a second gate metal layer, the fourth conductive layer is a source-drain metal layer; the first insulating layer is a first gate insulating layer, the second insulating layer is a second gate insulating layer, and the third insulating layer is an interlayer dielectric layer, but not limited to this.

Figure 10:
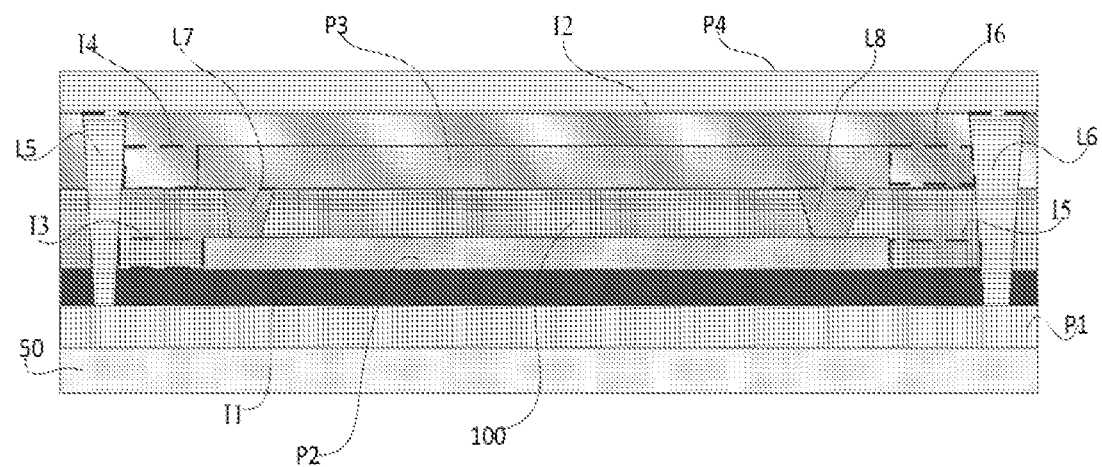
FIG. 10 is still yet another structural diagram of the capacitor circuit in the display substrate according to the embodiment of the present disclosure.

As shown in FIG. 10, the display substrate may include an active layer, a first gate insulating layer, a first gate metal, a second gate insulating layer 100, a second gate metal layer, an interlayer dielectric layer and a source-drain metal layer that are sequentially arranged on the base substrate 50 in an order from the base substrate 50 to the farthest;

In the embodiment shown in FIG. 10, the capacitor circuit may include a first electrode P1, a second electrode P2, a third electrode P3, a fourth electrode P4, a first insulating portion I1, a second insulating portion I2, a third insulating portion I3, a fourth insulating portion I4, a fifth insulating portion I5, and a sixth insulating layer 16;

The first electrode P1 is formed by the portion of the active layer that is a conductor, the second electrode P2 is formed by the first gate metal layer, and the third electrode P3 is formed by the second gate metal layer, the fourth electrode P4 is formed by the source-drain metal layer;

The first insulating portion I1 is formed by the first gate insulating layer, the second insulating portion I2 is formed by the interlayer dielectric layer, and the third insulating portion I3 and the fifth insulating portion I5 are formed by the second gate insulating layer 100, and the fourth insulating portion I4 and the sixth insulating portion I6 are both formed by the interlayer dielectric layer;

The first electrode P1, the first insulating portion IT and the second electrode P2 constitute the first capacitor included in the capacitor circuit, and the third electrode P3, the second insulating portion I2 and the four electrodes P4 form the second capacitor included in the capacitor circuit;

The orthographic projection of the first electrode P1 on the base substrate 50, the orthographic projection of the first insulating portion I1 on the base substrate 50, and the orthographic projection of the second electrode P2 on the base substrate 50 at least partially overlap; the orthographic projection of the third electrode P3 on the base substrate 50, the orthographic projection of the second insulating portion I2 on the base substrate 50 and the orthographic projections of the fourth electrode P4 on the base substrate 50 at least partially overlap;

The first electrode P1 is electrically connected to the fourth electrode P4 through a fifth conductive connection portion L5, and the fifth conductive connection portion L5 is arranged in the fifth via hole penetrating through the first insulating layer, the second conductive layer, the second insulating layer, the third conductive layer and the third insulating layer; the third insulating portion I3 is arranged between the fifth conductive connecting portion L5 and the second electrode P2, the fourth insulating portion I4 is arranged between the fifth conductive connection portion L5 and the third electrode P3;

The first electrode P1 is also electrically connected to the fourth electrode P4 through a sixth conductive connection portion L6, and the sixth conductive connection portion L6 is arranged in the sixth via hole penetrating through the first insulating layer, the second conductive layer, and the second insulating layer, the third conductive layer and the third insulating layer; the fifth insulating portion I5 is arranged between the sixth conductive connecting portion L6 and the second electrode P2, the sixth insulating portion I6 is arranged between the sixth conductive connection portion L6 and the third electrode P3;

The second electrode P2 is electrically connected to the third electrode P3 through a seventh conductive connection portion L7 and an eighth conductive connection portion L8; the seventh conductive connection portion L7 is arranged in the seventh via hole penetrating the second gate insulating layer 100, the eighth conductive connection portion L8 is arranged in the eighth via hole penetrating the second gate insulating layer 100.

As shown in FIG. 10, the capacitor circuit includes a first capacitor and a second capacitor connected in parallel with each other, there is a first facing area between the first electrode P1 and the second electrode P2, there is a second facing area between the third electrode P3 and the fourth electrode P4, there is a third facing area exists between the fifth conductive connection portion L5 and the second electrode P2, and there is a fourth facing area between the fifth conductive connection portion L5 and the third electrode P3, there is a fifth facing area between the sixth conductive connection portion L6 and the second electrode P2, and there is a sixth facing area between the sixth conductive connection portion L6 and the third electrode P3, which can improve the capacitance value of a capacitor circuit.

In the embodiment shown in FIG. 10, the structure of the capacitor circuit is a hollow square four-electrode capacitor structure.

In the embodiment shown in FIG. 10, the first conductive layer is a portion of the active layer that is a conductor, the second conductive layer is a first gate metal layer, and the third conductive layer is a second gate metal layer, the fourth conductive layer is a source-drain metal layer; the first insulating layer is a first gate insulating layer, the second insulating layer is a second gate insulating layer, and the third insulating layer is an interlayer dielectric layer.

The display device according to the embodiment of the present disclosure includes the above-mentioned pixel circuit.

The display device provided by at least one embodiment of the present disclosure may be any product or component with a display function, such as a mobile phone, a tablet computer, a TV, a monitor, a notebook computer, a digital photo frame, and a navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a pixel circuit, wherein the pixel circuit comprises a light-emitting element, a driving circuit and a capacitor circuit,
   the driving circuit is configured to drive the light-emitting element to emit light;
   a first terminal of the capacitor circuit is electrically connected to a control terminal of the driving circuit, and a second terminal of the capacitor circuit is electrically connected to a data writing-in node;
   the capacitor circuit includes at least two capacitors connected in parallel with each other;
   wherein the pixel circuit further comprises a compensation circuit, a data writing-in circuit, a light-emitting control circuit, an initialization circuit and a testing circuit;
   a first terminal of the driving circuit is connected to a power supply voltage;
   the data writing-in circuit is electrically connected to a gate line and a data line arranged on a base substrate of the display substrate, and the data writing-in node, and is configured to write a data voltage on the data line into the data writing-in node under the control of a gate driving signal provided by the gate line;
   the light-emitting control circuit is electrically connected to a light-emitting control line, a second terminal of the driving circuit, a first electrode of the light-emitting element, the data writing-in node and a reference voltage input terminal, is configured to connect the second terminal of the driving circuit and the first electrode of the light-emitting element under the control of a light-emitting control signal provided by the light-emitting control line, and write a reference voltage into the data writing-in node; the reference voltage input terminal is used to input the reference voltage, a second electrode of the light-emitting element is connected to a low voltage;
   the initialization circuit is electrically connected to a reset terminal, the reference voltage input terminal, an initialization voltage terminal, the data writing-in node and the second terminal of the driving circuit, and is configured to write the reference voltage into the data writing-in node under the control of a reset control signal provided by the reset terminal, and write an initialization voltage provided by the initialization voltage terminal into the control terminal of the driving circuit;
   the compensation circuit is electrically connected to the gate line, a control terminal of the driving circuit and the second terminal of the driving circuit, and is configured to connect the control terminal of the driving circuit and the second terminal of the driving circuit under the control of the gate driving signal;
   the test circuit is electrically connected to a test control terminal, the first electrode of the light-emitting element and the second electrode of the light-emitting element, is configured to connect the first electrode of the light-emitting element and the second electrode of the light-emitting element under the control of a test control signal provided by the test control terminal.

2. The display substrate according to claim 1, wherein the pixel circuit is arranged on a base substrate of the display substrate, and the display substrate comprises a first conductive layer, a first insulating layer, a second conductive layer, a second insulating layer and a third conductive layer sequentially arranged on the base substrate; the capacitor circuit includes a first electrode, a second electrode, a third electrode, a first insulating portion, a second insulating portion and a third insulating portion;

the first electrode includes the first conductive layer, the second electrode includes the second conductive layer, the third electrode includes the third conductive layer, and the first insulating portion includes the first insulating layer, the second insulating portion includes a first part of the second insulating layer and the third insulating portion includes a second part of the second insulating layer;

the at least two capacitors connected in parallel with each other include a first capacitor and a second capacitor, the first electrode, the first insulating portion and the second electrode constitute the first capacitor, and the second electrode, the second insulating portion and the third electrode constitute the second capacitor;

an orthographic projection of the first electrode on the base substrate, an orthographic projection of the first insulating portion on the base substrate, and an orthographic projection of the second electrode on the base substrate at least partially overlap; the orthographic projection of the second electrode on the base substrate, an orthographic projection of the second insulating portion on the base substrate, and an orthographic projection of the third electrode on the base substrate at least partially overlap;

the first electrode is electrically connected to the third electrode through a first conductive connection portion, and the first conductive connection portion is arranged in a first via hole penetrating through the first insulating layer, the second conductive layer and the second insulating layer, the third insulating portion is arranged between the first conductive connection portion and the second electrode.

3. The display substrate according to claim 2, wherein the first conductive layer is a first gate metal layer, the second conductive layer is a second gate metal layer, the third conductive layer is a source-drain metal layer, and the first insulating layer is a second gate insulating layer, and the second insulating layer is an interlayer dielectric layer; or,
the first conductive layer is a portion of an active layer that is a conductor, the second conductive layer is a first gate metal layer, the third conductive layer is a second gate metal layer, and the first insulating layer is a first gate insulating layer, and the second insulating layer is a second gate insulating layer.

4. The display substrate according to claim 1, wherein the pixel circuit is arranged on a base substrate of the display substrate, and the display substrate comprises a first conductive layer, a first insulating layer, a second conductive layer, a second insulating layer and a third conductive layer that are sequentially arranged on the base substrate; the capacitor circuit includes a first electrode, a second electrode, a third electrode, a first insulating portion, a second insulating portion, a third insulating portion and a fourth insulating portion;

the first electrode includes the first conductive layer, the second electrode includes the second conductive layer, the third electrode includes the third conductive layer, and the first insulating portion includes the first insulating layer, the second insulating portion includes a first part of the second insulating layer, the third insulating portion includes a second part of the second insulating layer and the fourth insulating portion includes a third part of the second insulating layer;

the at least two capacitors connected in parallel with each other include a first capacitor and a second capacitor, the first electrode, the first insulating portion and the second electrode constitute the first capacitor, and the second electrode, the second insulating portion and the third electrode constitute the second capacitor;

an orthographic projection of the first electrode on the base substrate, an orthographic projection of the first insulating portion on the base substrate, and an orthographic projection of the second electrode on the base substrate at least partially overlap; the orthographic projection of the second electrode on the base substrate, an orthographic projection of the second insulating portion on the base substrate, and an orthographic projection of the third electrode on the base substrate at least partially overlap;

the first electrode is electrically connected to the third electrode through a first conductive connection portion, and the first conductive connection portion is arranged in a first via hole penetrating through the first insulating layer, the second conductive layer and the second insulating layer, the third insulating portion is arranged between the first conductive connection portion and the second electrode;

the first electrode is further electrically connected to the third electrode through a second conductive connection portion, and the second conductive connection portion is arranged in a second via hole penetrating through the first insulating layer, the second conductive layer and the second insulating layer, the fourth insulating portion is arranged between the second conductive connection portion and the second electrode.

5. The display substrate according to claim 4, wherein the first conductive connection portion is arranged on a first side of the second electrode, the second conductive connection portion is arranged on a second side of the second electrode, and the first side and the second side are opposite sides.

6. The display substrate according to claim 5, wherein the first conductive layer is a first gate metal layer, the second conductive layer is a second gate metal layer, the third conductive layer is a source-drain metal layer, and the first insulating layer is a second gate insulating layer, and the second insulating layer is an interlayer dielectric layer; or,
the first conductive layer is a portion of an active layer that is a conductor, the second conductive layer is a first gate metal layer, the third conductive layer is a second gate metal layer, and the first insulating layer is a first gate insulating layer, and the second insulating layer is a second gate insulating layer.

7. The display substrate according to claim 4, wherein the first conductive layer is a first gate metal layer, the second conductive layer is a second gate metal layer, the third conductive layer is a source-drain metal layer, and the first insulating layer is a second gate insulating layer, and the second insulating layer is an interlayer dielectric layer; or,
the first conductive layer is a portion of an active layer that is a conductor, the second conductive layer is a first gate metal layer, the third conductive layer is a second gate metal layer, and the first insulating layer is a first gate insulating layer, and the second insulating layer is a second gate insulating layer.

8. The display substrate according to claim 1, wherein the pixel circuit is arranged on a base substrate of the display substrate, and the display substrate comprises a first conductive layer, a first insulating layer, a second conductive layer, a second insulating layer, a third conductive layer, a third insulating layer and a fourth conductive layer that are sequentially arranged on the base substrate;

the capacitor circuit includes a first electrode, a second electrode, a third electrode, a fourth electrode, a first insulating portion, a second insulating portion, a third insulating portion, a fourth insulating portion, and a fifth insulating portion;

the first electrode includes the first conductive layer, the second electrode includes the second conductive layer, the third electrode includes the third conductive layer, and the fourth electrode includes the fourth conductive layer;

the first insulating portion includes a first insulating layer, the second insulating portion includes a second insulating layer, the third insulating portion includes a first part of the third insulating layer, the fourth insulating portion includes a second part of the third insulating layer, and the fifth insulating portion includes a third part of the second insulating layer;

the at least two capacitors connected in parallel with each other include a first capacitor, a second capacitor and a third capacitor, the first electrode, the first insulating portion and the second electrode constitute the first capacitor; the second electrode, the second insulating portion and the third electrode constitute the second capacitor, the third electrode, the third insulating portion and the fourth electrode constitute the third capacitor;

an orthographic projection of the first electrode on the base substrate, an orthographic projection of the first insulating portion on the base substrate, and an orthographic projection of the second electrode on the base substrate at least partially overlap; the orthographic projection of the second electrode on the base substrate, an orthographic projection of the second insulating portion on the base substrate, and an orthographic projection of the third electrode on the base substrate at least partially overlap; the orthographic projection of the third electrode on the base substrate, an orthographic projection of the third insulating portion on the base substrate, and an orthographic projection of the fourth electrode on the base substrate at least partially overlap;

the first electrode is electrically connected to the third electrode through a third conductive connection portion, and the third conductive connection portion is arranged in a third via hole penetrating through the first insulating layer, the second conductive layer and the second insulating layer; the fifth insulating portion is arranged between the third conductive connection portion and the second electrode;

the second electrode is electrically connected to the fourth electrode through a fourth conductive connection portion, and the fourth conductive connection portion is arranged in a fourth via hole penetrating through the second insulating layer, the third conductive layer and the third insulating layer, the fourth insulating portion is arranged between the fourth conductive connection portion and the third electrode.

9. The display substrate according to claim 8, wherein the third conductive connection portion is arranged on a first side of the second electrode and the third electrode, and the fourth conductive connection portion is arranged on a second side of the second electrode and the third electrode, the first side and the second side are opposite sides.

10. The display substrate according to claim 9, wherein the first conductive layer is a portion of an active layer that is a conductor, the second conductive layer is a first gate metal layer, the third conductive layer is a second gate metal layer, the fourth conductive layer is a source-drain metal layer;

the first insulating layer is a first gate insulating layer, the second insulating layer is a second gate insulating layer, and the third insulating layer is an interlayer dielectric layer.

11. The display substrate according to claim 1, wherein the pixel circuit is arranged on a base substrate of the display substrate, and the display substrate comprises a first conductive layer, a first insulating layer, a second conductive layer, a second insulating layer, a third conductive layer, a third insulating layer and a fourth conductive layer that are sequentially arranged on the base substrate;

the capacitor circuit includes a first electrode, a second electrode, a third electrode, a fourth electrode, a first insulating portion, a second insulating portion, a third insulating portion, a fourth insulating portion, a fifth insulating portion, and a sixth insulating portion;

the second electrode is electrically connected to the third electrode;

the first electrode includes the first conductive layer, the second electrode includes the second conductive layer, the third electrode includes the third conductive layer, and the fourth electrode includes the fourth conductive layer;

the first insulating portion includes the first insulating layer, the second insulating portion includes a first part of the third insulating layer, the third insulating portion includes a first part of the second insulating layer, the fifth insulating portion includes a second part of the second insulating layer, the fourth insulating portion includes a second part of the third insulating layer and the sixth insulating portion includes a third part of the third insulating layer;

the at least two capacitors connected in parallel with each other include a first capacitor and a second capacitor, the first electrode, the first insulating portion and the second electrode constitute the first capacitor, and the third electrode, the second insulating portion and the fourth electrode constitute the second capacitor;

an orthographic projection of the first electrode on the base substrate, an orthographic projection of the first insulating portion on the base substrate, and an orthographic projection of the second electrode on the base substrate at least partially overlap; an orthographic projection of the third electrode on the base substrate, an orthographic projection of the second insulating portion on the base substrate, and an orthographic projection of the fourth electrode on the base substrate at least partially overlap;

the first electrode is electrically connected to the fourth electrode through a fifth conductive connection portion, and the fifth conductive connection portion is arranged in a fifth via hole penetrating through the first insulating layer, the second conductive layer, the second insulating layer, the third conductive layer and the third insulating layer; the third insulating portion is arranged between the fifth conductive connection portion and the second electrode, and the fourth insulating portion is arranged between the fifth conductive connection portion and the third electrode;

the first electrode is further electrically connected to the fourth electrode through a sixth conductive connection portion, and the sixth conductive connection portion is arranged in a sixth via hole penetrating through the first insulating layer, the second conductive layer, the second insulating layer, the third conductive layer and the third insulating layer; the fifth insulating portion is arranged between the sixth conductive connecting portion and the second electrode, and the sixth insulating portion is arranged between the sixth conductive connection portion and the third electrode.

12. The display substrate according to claim 11, wherein the fifth conductive connection portion is arranged on a first side of the second electrode and the third electrode, and the sixth conductive connection portion is arranged on a second side of the second electrode and the third electrode, the first side and the second side are opposite side.

13. The display substrate according to claim 12, wherein the first conductive layer is a portion of an active layer that is a conductor, the second conductive layer is a first gate metal layer, the third conductive layer is a second gate metal layer, the fourth conductive layer is a source-drain metal layer;
the first insulating layer is a first gate insulating layer, the second insulating layer is a second gate insulating layer, and the third insulating layer is an interlayer dielectric layer.

14. The display substrate according to claim 11, wherein the first conductive layer is a portion of an active layer that is a conductor, the second conductive layer is a first gate metal layer, the third conductive layer is a second gate metal layer, the fourth conductive layer is a source-drain metal layer;
the first insulating layer is a first gate insulating layer, the second insulating layer is a second gate insulating layer, and the third insulating layer is an interlayer dielectric layer.

15. The display substrate according to claim 1, wherein the driving circuit comprises a third transistor, the at least two capacitors connected in parallel with each other comprise a first capacitor and a second capacitor, and the data writing-in circuit comprises a fourth transistor, the light-emitting control circuit includes a fifth transistor and a sixth transistor, the initialization circuit includes a first transistor and a seventh transistor, the compensation circuit includes a second transistor, the test circuit includes an eighth transistor, the light-emitting element is a micro light-emitting diode;
a first terminal of the first capacitor is electrically connected to a first terminal of the second capacitor, and a second terminal of the first capacitor is electrically connected to a second terminal of the second capacitor;
the first terminal of the first capacitor is electrically connected to the control node, and the second terminal of the second capacitor is electrically connected to the data writing-in node;

a gate electrode of the third transistor is electrically connected to the control node, a source electrode of the third transistor is connected to the power supply voltage, and a drain electrode of the third transistor is connected to a source electrode of the sixth transistor;

a gate electrode of the fourth transistor is electrically connected to the gate line, a source electrode of the fourth transistor is connected to the data voltage on the data line, and a drain electrode of the fourth transistor is connected to the data writing-in node;

a gate electrode of the sixth transistor is electrically connected to the light-emitting control line, and a drain electrode of the sixth transistor is electrically connected to an anode of the micro light-emitting diode;

a gate electrode of the fifth transistor is electrically connected to the light-emitting control line, a source electrode of the fifth transistor is connected to the reference voltage, and a drain electrode of the fifth transistor is electrically connected to the data writing-in node;

a gate electrode of the seventh transistor is electrically connected to the reset terminal, a source electrode of the seventh transistor is connected to the reference voltage, and a drain electrode of the seventh transistor is electrically connected to the data writing-in node;

a gate electrode of the first transistor is electrically connected to the reset terminal, a source electrode of the first transistor is connected to the initialization voltage, and a drain electrode of the first transistor is electrically connected to the control node;

a gate electrode of the second transistor is electrically connected to the gate line, a source electrode of the second transistor is electrically connected to the control node, and a drain electrode of the second transistor is electrically connected to the drain electrode of the third transistor;

a gate electrode of the eighth transistor is electrically connected to the test control terminal, a source electrode of the eighth transistor is electrically connected to the anode of the micro light-emitting diode, and a drain electrode of the eighth transistor is electrically connected to a cathode of the micro light-emitting diode;

the cathode of the micro light-emitting diode is connected to the low voltage.

16. A display device comprising the display substrate according to claim 1.

* * * * *